(12) United States Patent
Lee et al.

(10) Patent No.: US 7,923,284 B2
(45) Date of Patent: *Apr. 12, 2011

(54) METHOD OF MANUFACTURING ORGANIC LIGHT EMITTING DISPLAY

(75) Inventors: Jaeyoon Lee, Seoul (KR); Choongkeun Yoo, Incheon (KR); Aekyung Jeon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 197 days.

This patent is subject to a terminal disclaimer.

(21) Appl. No.: 12/292,999

(22) Filed: Dec. 2, 2008

(65) Prior Publication Data

US 2009/0269866 A1 Oct. 29, 2009

(30) Foreign Application Priority Data

Apr. 25, 2008 (KR) .......................... 10-2008-0039046

(51) Int. Cl.
*H01L 21/00* (2006.01)
(52) U.S. Cl. .................. 438/99; 438/158; 257/E21.024
(58) Field of Classification Search .................. 438/159, 438/950; 257/E21.024
See application file for complete search history.

(56) References Cited

U.S. PATENT DOCUMENTS

| 6,284,307 | B1 | 9/2001 | Fukuzawa et al. | |
| 7,199,516 | B2 * | 4/2007 | Seo et al. | 313/504 |
| 7,291,970 | B2 * | 11/2007 | Kuwabara | 313/504 |
| 2007/0122923 | A1 | 5/2007 | Kho et al. | |

FOREIGN PATENT DOCUMENTS

| EP | 1 752 306 | 2/2007 |
| KR | 2007-0107527 | 11/2007 |

* cited by examiner

*Primary Examiner* — Chandra Chaudhari
(74) *Attorney, Agent, or Firm* — Morgan, Lewis & Bockius LLP

(57) ABSTRACT

A method of manufacturing an organic light emitting display is disclosed. The method includes forming a first electrode and a bank layer including an opening area exposing the first electrode on a target substrate, forming a medium substrate including an organic layer and an absorbing layer on the target substrate, forming a mask including an opening corresponding to the opening area of the bank layer on the medium substrate, emitting light on the medium substrate through the mask and transferring the organic layer on a portion of the first electrode exposed by the bank layer to form an organic light emitting layer on the target substrate, and forming a second electrode on the organic light emitting layer.

10 Claims, 4 Drawing Sheets

METHOD OF MANUFACTURING ORGANIC LIGHT EMITTING DISPLAY

This application claims priority from Korean Patent Application No. 10-2008-0039046, filed on Apr. 25, 2008, the contents of which are incorporated herein by reference in its entirety.

BACKGROUND OF THE INVENTION

1. Field of the Invention

The present invention relate to a method of manufacturing an organic light emitting display.

2. Description of the Related Art

An organic light emitting element used in an organic light emitting display has a self-emission structure in which a light emitting layer is formed between two electrodes on a substrate.

The organic light emitting element is classified into a top or emission type organic light emitting element and a bottom emission type organic light emitting element depending on a direction in which light is emitted. The organic light emitting element is also classified into a passive or matrix type organic light emitting element and an active matrix type organic light emitting element depending on a manner in which the display is driven.

In the organic light emitting display, a scan signal, a data signal, a power, etc. are supplied to a plurality of subpixels arranged in a matrix format and light is emitted from the selected subpixels, thereby displaying an image.

In a method of manufacturing the organic light emitting display, an organic light emitting layer may be formed by aligning a shadow mask with a target substrate in a vacuum chamber and depositing an organic material on an opening area on the target substrate. The above method has been widely used to form the organic emitting layer.

However, in the method for forming the organic emitting layer, the opening area has to be formed in consideration of a hand-down phenomenon of the shadow mask, and a pitch of the shadow mask has to be controlled depending on resolution. So, a transfer method using a spot beam laser was introduced in a related art.

The transfer method using the spot beam laser is advantageous to pattern a large area. However, in the transfer method using the spot beam laser, it is difficult to perform a selective transfer, and the amount of consumed material is more than the amount of transferred material. Accordingly, another method capable of solving the above problems needs to be proposed.

SUMMARY OF THE INVENTION

Additional features and advantages of the exemplary embodiments of the invention will be set forth in the description which follows, and in part will be apparent from the description, or may be learned by practice of the exemplary embodiments of the invention. The objectives and other advantages of the exemplary embodiments of the invention will be realized and attained by the structure particularly pointed out in the written description and claims hereof as well as the appended drawings.

In one aspect, a method of manufacturing an organic light emitting display comprises forming a first electrode and a bank layer including an opening area exposing the first electrode on a target substrate, forming a medium substrate including an organic layer and an absorbing layer on the target substrate, forming a mask including an opening corresponding to the opening area of the bank layer on the medium substrate, emitting light on the medium substrate through the mask and transferring the organic layer on a portion of the first electrode exposed by the bank layer to form an organic light emitting layer on the target substrate, and forming a second electrode on the organic light emitting layer.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF EMBODIMENTS

Reference will now be made in detail embodiments of the invention examples of which are illustrated in the accompanying drawings.

Figure 1:
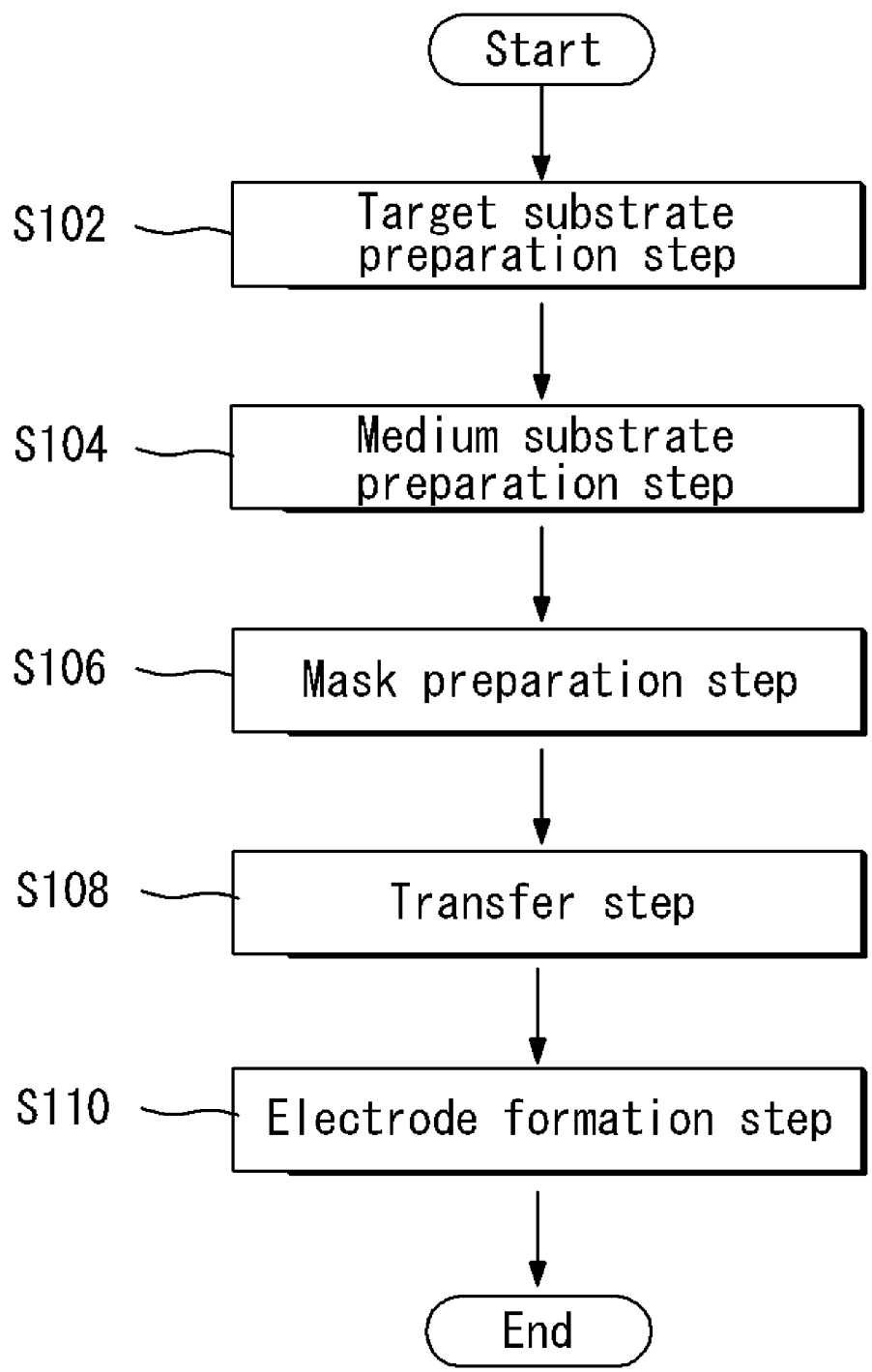
FIG. 1 is a flow chart schematically illustrating a method of manufacturing an organic light emitting display according to an embodiment of the invention.

As shown in FIG. 1, a method of manufacturing an organic light emitting display according to an exemplary embodiment of the invention may include a target substrate preparation step S102, a medium substrate preparation step S104, a mask preparation step S106, a transfer step S108, and an electrode formation step S110.

In the target substrate preparation step S102, a first electrode and a bank layer including an opening area for exposing the first electrode are formed on the target substrate.

The target substrate may be used in a passive matrix type organic light emitting display and an active matrix type organic light emitting display. In the exemplary embodiment of the invention, the active matrix type organic light emitting display is described below as an example.

Figure 2:
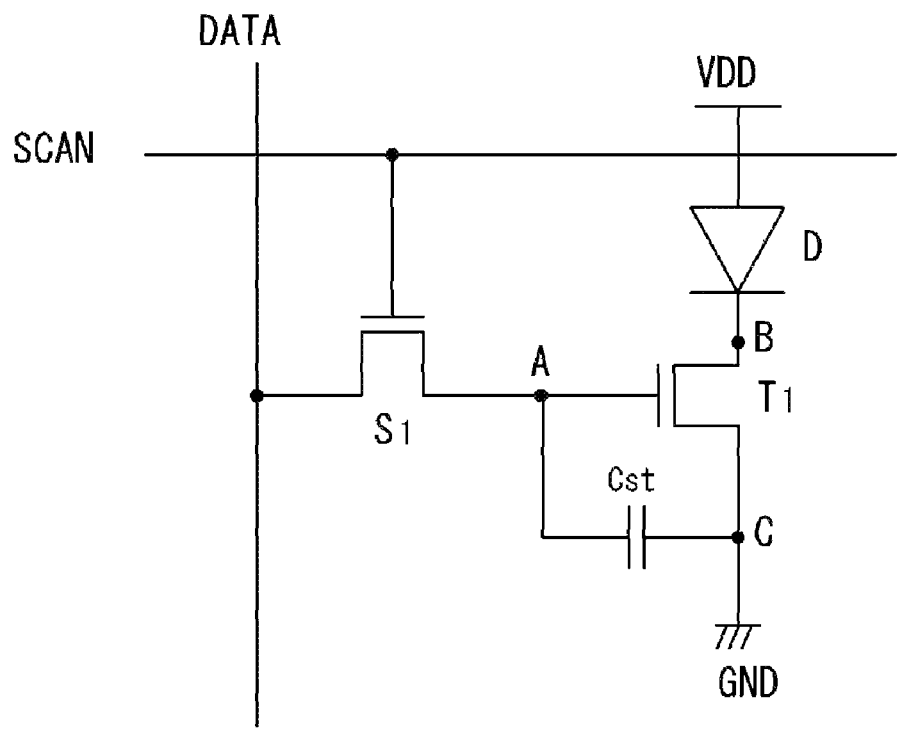
FIG. 2 illustrates a circuit configuration of a subpixel to be formed on a target substrate.

A circuit configuration of a subpixel shown in FIG. 2 is only one example illustrated so as to facilitate the understanding of explanation, and the exemplary embodiment of the invention is not limited thereto.

As shown in FIG. 2, a subpixel may include a switching transistor S1, an organic light emitting diode D, a drive transistor T1, and a capacitor Cst. A gate of the switching transistor S1 is connected to a scan line SCAN to which a scan signal is supplied. One terminal of the switching transistor S1 is connected a data line DATA to which a data signal is supplied, and the other terminal is connected to a first node A. In the organic light emitting diode D, a first power line VDD to which a positive power is supplied is connected to a first electrode, and a second electrode is connected to a second node B. A gate of the drive transistor T1 is connected to the first node A. One terminal of the drive transistor T1 is connected to the second electrode of the organic light emitting diode D, and the other terminal is connected to a third node C. One terminal of the capacitor Cst is connected to the first node A, and the other terminal is connected to the third node C and a second power line GND.

In FIG. 2, the switching transistor S1 and the drive transistor T1 are an N-type transistor as an example, but are not limited thereto.

The positive power supplied through the first power line VDD may be greater than a negative power supplied through the second power line GND. Levels of powers supplied through the first power line VDD and the second power line GND may be switched depending on a driving manner.

In the subpixel, when the scan signal is supplied through the scan line SCAN, the switching transistor S1 is turned on. Next, when the data signal supplied through the data line DATA is supplied to the first node A through the turned on switching transistor S1, the capacitor Cst stores the data signal as a data voltage. Next, when the scan signal is cut off and the switching transistor S1 is turned off, the drive transistor T1 is driven by the data voltage stored in the capacitor Cst. Next, when the positive power supplied through the first power line VDD flows through the second power line GND, the organic light emitting diode D emits light. The above-described subpixel drive manner is only one example, and the exemplary embodiment of the invention is not limited thereto.

A section structure of the subpixel on the target substrate is described below in detail with reference to FIG. 3.

Figure 3:
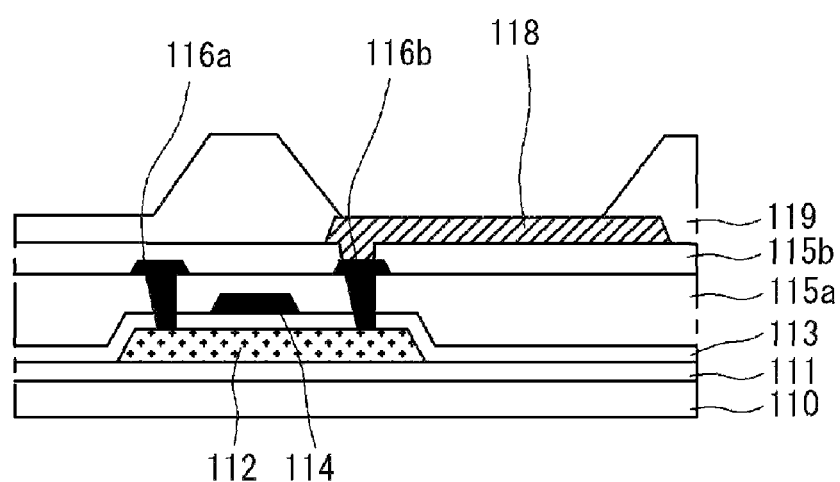
FIG. 3 is a cross-sectional view of the subpixel.

As shown in FIG. 3, in case a target substrate 110 is used in an active matrix type organic light emitting display, a transistor unit is positioned under a first electrode 118, and the first electrode 118 is connected to a source 116a or a drain 116b of a transistor included in the transistor unit.

The transistor unit may include a buffer layer 111 on the target substrate 110, a semiconductor layer 112 on the buffer layer 111, a first insulating layer 113 on the semiconductor layer 112, a gate 114 on the first insulating layer 113, a second insulating layer 115a on the first insulating layer 113 and the gate 114, and the source 116a and the drain 116b on the second insulating layer 115a. The source 116a and the drain 116b are connected to the semiconductor layer 112 through a contact hole. The transistor unit may include a planarization layer 115b on the source 116a and the drain 116b, the first electrode 118 on the planarization layer 115b, and a bank layer 119 on the first electrode 118. The first electrode 118 is connected to the source 116a or the drain 116b through a contact hole. The bank layer 119 includes an opening area exposing the first electrode 118.

The target substrate 110 may be a glass substrate, a metal substrate, a ceramic substrate, or a plastic substrate. The plastic substrate may be formed of polycarbonate resin, acrylic resin, vinyl chloride resin, polyethyleneterephthalate resin, polyimide resin, polyester resin, epoxy resin, silicon resin, and fluorine resin, but is not limited thereto.

The buffer layer 111 prevents impurities (e.g., alkali ions discharged from the target substrate 110) from being introduced during formation of a thin film transistor in a succeeding process. The buffer layer 111 may be selectively formed using silicon oxide ($SiO_2$), silicon nitride ($SiN_x$), or using other materials.

The semiconductor layer 112 may include a source region and a drain region including p-type or n-type impurities. The semiconductor layer 112 may include a channel region in addition to the source region and the drain region.

The first insulating layer 113 may include a silicon oxide ($SiO_x$) layer, a silicon nitride ($SiN_x$) layer, or a multi-layered structure or a combination thereof, but is not limited thereto.

The gate 114 may be formed of any one selected from the group consisting of molybdenum (Mo), aluminum (Al), chromium (Cr), gold (Au), titanium (Ti), nickel (Ni), neodymium (Nd) and copper (Cu), or a combination thereof, but is not limited thereto. The gate 114 may have a multi-layered structure formed of Mo, Al, Cr, Au, Ti, Ni, Nd, or Cu, or a combination thereof. For example, the gate 114 may have a double-layered structure including Mo/Al—Nd or Mo/Al, but is not limited thereto.

The source 116a and the drain 116b may have a single-layered structure or a multi-layered structure. When the source 116a and the drain 116b have the single-layered structure, the source 116a and the drain 116b may be formed of Mo, Al, Cr, Au, Ti, Ni, Nd, or Cu, or a combination thereof. When the source 116a and the drain 116b have the multi-layered structure, the source 116a and the drain 116b may have a double-layered structure including Mo/Al—Nd or a triple-layered structure including Mo/Al/Mo or Mo/Al—Nd/Mo.

Data lines (not shown), a capacitor upper electrode (not shown), and power lines (not shown) may be positioned on the same formation layer as the source 116a and the drain 116b.

The second insulating layer 115a may be formed of an inorganic material such as silicon oxide ($SiO_x$) and silicon nitride ($SiN_x$) through a silicate-on-glass (SOG) method, but is not limited thereto.

The planarization layer 115b may be formed using a method such as spin on glass (SOG) obtained by coating an organic material such as polyimide, benzocyclobutene-based resin and acrylate in a liquid state and then curing it, but is not limited thereto. At least one of the second insulating layer 115a and the planarization layer 115b may be omitted.

The first electrode 118 may be an anode electrode. In case the organic light emitting display has a bottom emission or dual emission structure, the first electrode 118 may be formed of a transparent material such as indium-tin-oxide (ITO), indium-zinc-oxide (IZO), or zinc oxide (ZnO). In case the organic light emitting display has a top emission structure, the first electrode II 8 may include a layer formed of one of ITO. IZO or ZnO, and a reflective layer formed of one of Al, Ag or Ni under the layer. Further, the first electrode 118 may have a multi-layered structure in which the reflective layer is formed between two layers formed of one of ITO, IZO or ZnO.

Figure 4:
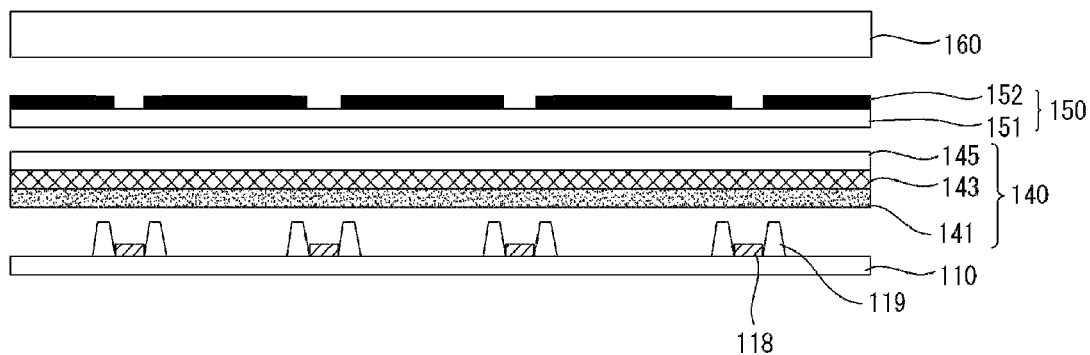
FIGS. 4 to 6 are cross-sectional views sequentially illustrating each of stages in the method of manufacturing the organic light emitting display.
Figure 5:
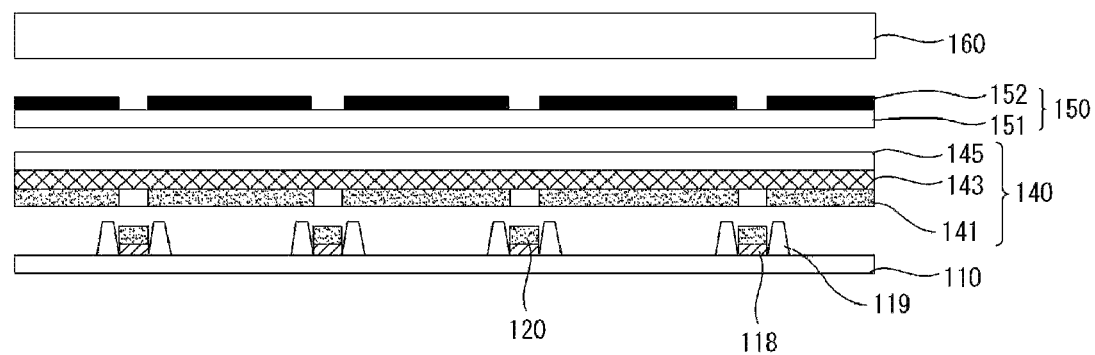
Figure 6:
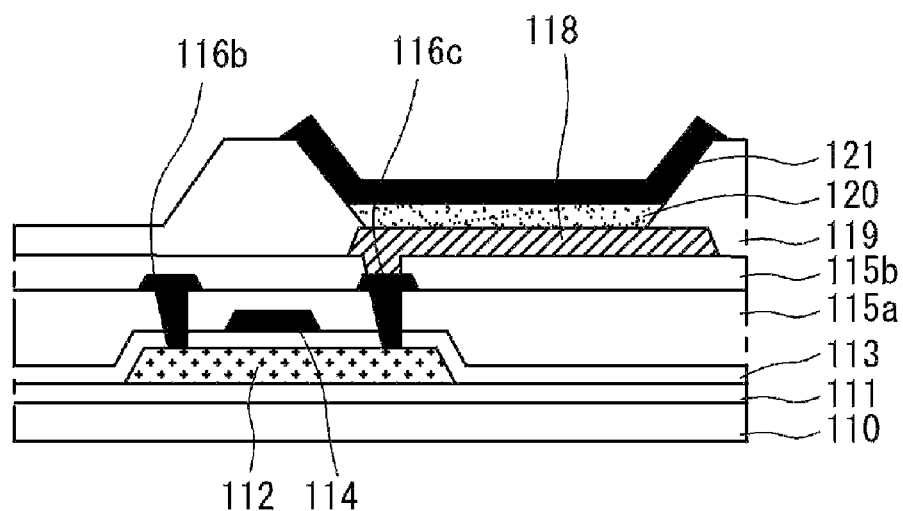

FIGS. 4 to 6 are cross-sectional views sequentially illustrating each of stages in the method of manufacturing the organic light emitting display.

In the medium substrate preparation step S104 shown in FIG. 1, as shown in FIG. 4, a medium substrate 140 including an organic layer 141 and an absorbing layer 143 is formed on the target substrate 110.

After the medium substrate 140 is formed on the target substrate 110, they may be vacuum-attached to each other, but are not limited thereto.

The medium substrate 140 further includes a first base substrate 145 facing a mask 150. The absorbing layer 143 is interposed between the first base substrate 145 and the organic layer 141. The organic layer 141 and the absorbing layer 143 may be positioned to correspond to the size of the first base substrate 145, but may be smaller than the size of the first base substrate 145.

A sputtering method may be used to form the organic layer 141 and the absorbing layer 143 on the first base substrate 145, but the exemplary embodiment is not limited thereto. The absorbing layer 143 may be formed of metal having an excellent transmittance against light emitted by a laser 160. The medium substrate 140 may be referred to as a donor substrate.

In the mask preparation step S106 shown in FIG. 1, as shown in FIG. 4, the mask 150 is formed oil the medium substrate 140 so that the opening area of the bank layer 119 exposing the first electrode 118 on the target substrate 110 corresponds to an opening of the mask 150.

The mask 150 may include a second base substrate 151 facing the medium substrate 140 and metal layers 152 on the second base substrate 151. The metal layers 152 may be spaced apart from each other on the second base substrate 151 to form openings. The size of the openings of the metal layers 152 may be equal to or smaller than the size of the opening area of the bank layer 119. The metal layers 152 may be formed of a material that cannot transmit and absorb the light emitted by the laser 160. Hence, if the laser 160 emits light, the light beam is shielded or reflected by the metal layers 152 in another portion except a portion exposed by the openings of the metal layers 152.

The mask 150 and the medium substrate 140 on the target substrate 110 may contact each other, or may be spaced apart from each other at a distance of several micrometers (μm) to several millimeters (mm).

In the transfer step S108 shown in FIG. 1, as shown in FIG. 5, the laser 160 emits light on the medium substrate 140 through the mask 150, and the organic layer 141 is transferred on an exposed portion of the first electrode 118 inside the bank layer 119 to form an organic light emitting layer 120.

If the laser 160 emits the light on the mask 150, the organic layer 141 is transferred on the exposed portion of the first electrode 118 through the opening area of the bank layer 119 to form the organic light emitting layer 120 on the first electrode 118.

The laser 160 may use a line beam laser that entirely scans the target substrate 110 and the medium substrate 140 in an attached state every 1 line to emit light. The line bean laser may emit the light one time or several times. As above, a method using the line beam laser can further improve the production yield as compared with a method using a spot beam laser.

The organic layer 141 on the medium substrate 140 is formed of organic materials of the same color. For example, if the medium substrate 140 is formed so that a red medium substrate, a green medium substrate and a blue medium substrate are dividedly formed, the organic layer 141 having a color corresponding to a color of each subfield is transferred. Hence, the mask 140 may be formed so that a red mask, a green mask and a blue mask are dividedly formed.

Because the medium substrate 140 includes the organic layer 141 having the color corresponding to the color of each subfield, the remaining organic layer 141 after the first transfer of the organic layer 141 can be reused by moving the mask 150. Hence, the use efficiency of material can be improved and the manufacturing cost can be reduced. For example, in case red, green, and blue subpixels constitute one pixel, an organic transfer method using the medium substrate 140 can greatly increase the use efficiency of material.

In the electrode formation step S110 shown in FIG. 1, as shown in FIG. 5, the second electrode is formed on the organic light emitting layer 120 on the target substrate 110.

As shown in FIG. 6, a second electrode 121 is formed on the organic light emitting layer 120 by separating the target substrate 110 from the medium substrate 140, moving the target substrate 110 into another chamber, and performing a deposition process.

The subpixel may include an organic light emitting diode that includes the first electrode 118, the organic light emitting layer 120, and the second electrode 121. In the exemplary embodiment, the organic light emitting diode may have a structure shown in FIG. 7.

Figure 7:
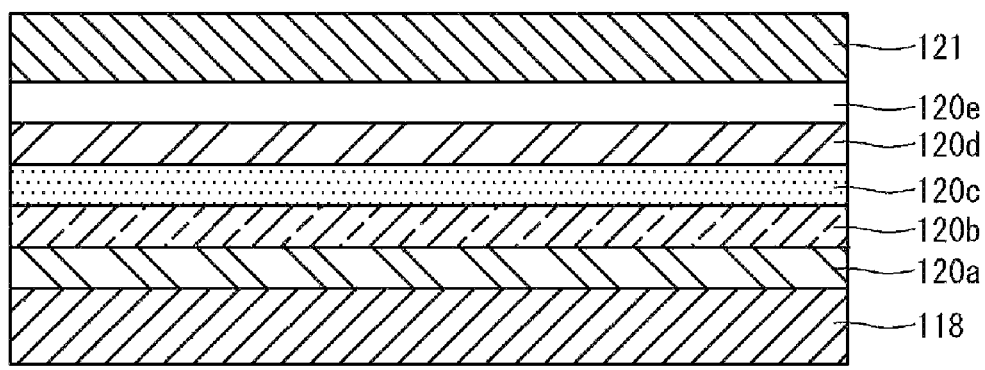
FIG. 7 is a cross-sectional view illustrating a structure of an organic light emitting diode.

As shown in FIG. 7, the organic light emitting diode may include the first electrode 118, the organic light emitting layer 120, and the second electrode 121. The organic light emitting layer 120 may include a hole injection layer 120a, a hole transport layer 120b, a light emitting layer 120c, an electron transport layer 120d, and an electron injection layer 120e.

The hole injection layer 120a may be positioned on the first electrode 118. The hole injection layer 120a may function to facilitate the injection of holes from the first electrode 118 to the light emitting layer 120c. The hole injection layer 120a may be formed of at least one selected from the group consisting of copper phthalocyanine (CuPc), PEDOT(poly(3,4)-ethylenedioxythiophene), polyaniline (PANI) and NPD(N,N-dinaphthyl-N,N'-diphenyl benzidine), but is not limited thereto;

The hole transport layer 120b functions to smoothly transport holes. The hole transport layer 120b may be formed from at least one selected from the group consisting of NPD(N,N-dinaphthyl-N,N'-diphenyl benzidine), TPD(N,N'-bis-(3-methylphenyl)-N,N'-bis-(phenyl)-benzidine, s-TAD and MTDATA(4,4',4''-Tris(N-3-methylphenyl-N-phenyl-amino)-triphenylamine), but is not limited thereto.

The light emitting layer 120c may be formed of a material capable of producing red, green, blue and white light, for example, a phosphorescence material or a fluorescence material.

In case the light emitting layer 120c produces red light, the light emitting layer 120c includes a host material including carbazole biphenyl (CBP) or N,N-dicarbazolyl-3,5-benzene (mCP). Further, the light emitting layer 120c may be formed of a phosphorescence material including a dopant material including any one selected from the group consisting of PIQIr(acac)(bis(1-phenylisoquinoline)acetylacetonate iridium), PQIr(acac)(bis(1-phenylquinoline)acetylacetotiate iridium), PQIr(tris(1-phenylquinoline)iridium) and PtOEP(octaethylporphyrin platinum) or a fluorescence material including PBD:Eu(DBM)3(Phen) or Perylene, but is not limited thereto.

In case the light emitting layer 120c produces green light, the light emitting layer 120c includes a host material including CBP or mCP. Further, the light emitting layer 120c may be formed of a phosphorescence material including a dopant material including Ir(ppy)3(fac tris(2-phenylpyridine)iridium) or a fluorescence material including Alq3(tris(8-hydroxyquinolino)aluminum), but is not limited thereto.

In case the light emitting layer 120c produces blue light, the light emitting layer 120c includes a host material including CBP or mCP. Further, the light emitting layer 120c may be formed of a phosphorescence material including a dopant material including (4,6-F2 ppy)2Irpic or a fluorescence material including any one selected from the group consisting of spiro-DPVBi, spiro-6P, distyryl-benzene (DSB), distyryl-arylene (DSA), PFO-based polymer, PPV-based polymer and a combination thereof, but is not limited thereto.

The electron transport layer 120d functions to facilitate the transportation of electrons. The electron transport layer 120d may be formed of at least one selected from the group consisting of Alq3(tris(8-hydroxyquinolino)aluminum, PBD, TAZ, spiro-PBD, BAlq, and SAlq, but is not limited thereto.

The electron transport layer 120d can also function to prevent holes, which are injected from the first electrode 118 and then pass through the light emitting layer 120c, from moving to the second electrode 180. In other words, the electron transport layer 120*d* serves as a hole stop layer to facilitate the coupling of holes and electrons in the light emitting layer 120*c*.

The electron injection layer 120*e* functions to facilitate the injection of electrons. The electron injection layer 120*e* may be formed of Alq3(tris(8-hydroxyquinolino)aluminum), PBD, TAZ, spiro-PBD, BAlq or SAlq, but is not limited thereto.

The hole injection layer 120*a* or the electron injection layer 120*e* may further include an inorganic material. The inorganic material may further include a metal compound. The metal compound may include alkali metal or alkaline earth metal. The metal compound including) the alkali metal or the alkaline earth metal may include at least one selected from the group consisting of LiQ, LiF, NaF, KF, RbF, CsF, FrF, $BeF_2$, $MgF_2$, $CaF_2$, $SrF_2$, $BaF_2$, and $RaF_2$, but is not limited thereto.

Thus, the inorganic material inside the electron injection layer 120*e* facilitates hopping of electrons injected from the second electrode 180 to the light emitting layer 120*c*, so that holes and electrons injected into the light emitting layer 120*c* are balanced. Accordingly, the light emission efficiency can be improved.

Further, the inorganic material inside the hole injection layer 120*a* reduces the mobility of holes injected from the first electrode 118 to the light emitting layer 120*c*, so that holes and electrons injected into the light emitting layer 120*c* are balanced. Accordingly, the light emission efficiency can be improved.

At least one of the electron injection layer 120*e*, the electron transport layer 120*d*, the hole transport layer 120*b*, and the hole injection layer 120*a* may be omitted.

As described above, in the method of manufacturing the organic light emitting display, it is easy to manufacture a large-sized panel, the production yield can be improved by reducing a process time. Further, because the medium substrate is reused, the use efficiency of material can increase and the manufacturing cost can be reduced.

It will be apparent to those skilled in the art that various modifications and variations can be made in the embodiments of the invention without departing from the spirit or scope of the invention. Thus, it is intended that embodiments of the invention cover the modifications and variations of this invention provided they come within the scope of the appended claims and their equivalents.

What is claimed is:

1. A method of manufacturing an organic light emitting display comprising:
    forming a first electrode and a bank layer including a first opening area exposing the first electrode on a target substrate;
    aligning a medium substrate including an organic layer and an absorbing layer on the target substrate;
    aligning a mask including a second opening corresponding to the first opening area of the bank layer on the medium substrate;
    emitting light on the medium substrate through the mask and transferring the organic layer on a portion of the first electrode exposed by the bank layer to form an organic light emitting layer on the target substrate; and
    forming a second electrode on the organic light emitting layer.

2. The method of claim 1, wherein the medium substrate includes a first base substrate facing the mask, and the absorbing layer is interposed between the first base substrate and the organic layer.

3. The method of claim 2, wherein the size of the organic layer and the absorbing layer corresponds to the size of the first base substrate.

4. The method of claim 1, wherein the mask includes a second base substrate facing the medium substrate and metal layers on the second base substrate, the metal layers being spaced apart from each other to form the opening.

5. The method of claim 4, wherein the metal layer has a property of non-transmitting and non-absorbing the light.

6. The method of claim 1, wherein the absorbing layer is formed of a metal material having an excellent property of transmitting against the light.

7. The method of claim 1, wherein the organic layer is formed of organic materials of the same color.

8. The method of claim 1, wherein the target substrate further includes a transistor unit under the first electrode, and the first electrode is connected to a source or a drain of a transistor included in the transistor unit.

9. The method of claim 1, wherein the light is emitted by a line beam laser.

10. The method of claim 1, wherein the mask and the medium substrate contact each other, or are spaced apart from each other.

* * * * *